(12) United States Patent
Mohammed et al.

(10) Patent No.: US 9,566,764 B1
(45) Date of Patent: Feb. 14, 2017

(54) FAST CURE CONDUCTIVE EPOXY ATTACH METHODOLOGY FOR HIGH SPEED AUTOMATED PROCESSES

(71) Applicant: Flextronics AP, LLC, Broomfield, CO (US)

(72) Inventors: Anwar Mohammed, San Jose, CA (US); Weifeng Liu, Dublin, CA (US); David Geiger, Dublin, CA (US); Dennis Willie, San Jose, CA (US); Gervasio Mutarelli, Livermore, CA (US); Murad Kurwa, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 73 days.

(21) Appl. No.: 14/579,631

(22) Filed: Dec. 22, 2014

Related U.S. Application Data

(60) Provisional application No. 61/919,571, filed on Dec. 20, 2013.

(51) Int. Cl.
| | |
|---|---|
| *B32B 3/00* | (2006.01) |
| *B32B 7/14* | (2006.01) |
| *B32B 37/12* | (2006.01) |
| *B32B 37/16* | (2006.01) |
| *B32B 37/06* | (2006.01) |
| *H05K 3/36* | (2006.01) |
| *H05K 1/11* | (2006.01) |

(52) U.S. Cl.
CPC ............... *B32B 7/14* (2013.01); *B32B 37/06* (2013.01); *B32B 37/12* (2013.01); *B32B 37/16* (2013.01); *H05K 1/11* (2013.01); *H05K 3/36* (2013.01); *B32B 2307/20* (2013.01); *B32B 2307/202* (2013.01); *B32B 2363/00* (2013.01); *B32B 2457/00* (2013.01)

(58) Field of Classification Search
CPC ............ B32B 37/00; B32B 37/06; B32B 7/14; B32B 17/06; B32B 17/10036; H05K 3/321; H05K 2201/0195
See application file for complete search history.

(56) References Cited

U.S. PATENT DOCUMENTS

| | | | | |
|---|---|---|---|---|
| 4,481,258 A | * | 11/1984 | Sattler | C08F 299/028 427/116 |
| 4,999,136 A | * | 3/1991 | Su | C08F 299/028 252/512 |

* cited by examiner

*Primary Examiner* — Elizabeth Mulvaney
(74) *Attorney, Agent, or Firm* — Haverstock & Owens LLP

(57) ABSTRACT

Two substrates are mechanically and electrically coupled together using a combination of a fast cure electrically non-conductive epoxy for mechanical attachment and a slow cure electrically conductive epoxy for electrical interconnects. The two epoxies are selectively applied between the two substrates as a stack, and the stack is subjected to a temperature that is sufficient to cure the fast cure electrically non-conductive epoxy in a short period of time but does not damage the substrates or components coupled thereto. In some applications, the temperature is less than 100 degrees Celsius and the time period is less than 5 seconds. The stack is removed from the heat and the slow cure electrically conductive epoxy continues to cure over a longer second period of time, such as a few hours to a day.

19 Claims, 1 Drawing Sheet

FAST CURE CONDUCTIVE EPOXY ATTACH METHODOLOGY FOR HIGH SPEED AUTOMATED PROCESSES

RELATED APPLICATIONS

This Patent Application claims priority under 35 U.S.C. 119(e) of the U.S. provisional patent application, Application No. 61/919,571, filed on Dec. 20, 2014, and entitled "FAST CURE (<5 SECONDS) CONDUCTIVE EPOXY ATTACH METHODOLOGY FOR HIGH SPEED AUTOMATED PROCESSES", which is hereby incorporated in its entirety by reference.

FIELD OF THE INVENTION

The present invention is generally directed to conductive epoxies and the coupling of two substrates using epoxy. More specifically, the present invention is directed to a fast cure conductive epoxy methodology for high speed automated processes and the resulting device.

BACKGROUND OF THE INVENTION

Using an adhesive is a common technique for securing objects together. Multi-part adhesives harden by mixing two or more components which chemically react. The individual components are not adhesive by nature. The individual components react with each other after being mixed and show full adhesion only upon curing.

Epoxy is the cured end product of epoxy resins. Epoxy is also a common name for a type of strong adhesive used for adhering objects together and covering surfaces, typically two resins are mixed together before use. Epoxy resins may be reacted either with themselves or with a wide range of co-reactants. These co-reactants are often referred to as hardeners or curatives, and the cross-linking reaction is commonly referred to as curing. Heat curing epoxies consist of a pre-made mixture of two or more components that when heat is applied the components react and cross-link.

Many electronic devices require application of an epoxy for adhering together various device components. Conductive epoxies are particularly important for additionally providing electrical interconnection between two adhered device components. Unfortunately, some electronic devices, or more particularly one or more components within an electronic device, cannot handle high temperatures, such as greater than 100 degree Celsius, necessary for curing a conductive epoxy. Attaching device components with a conductive epoxy at temperatures below 100 degrees Celsius requires longer curing time periods, which is not acceptable for high speed automated fabrication processes.

SUMMARY OF THE INVENTION

Two substrates are mechanically and electrically coupled together using a combination of a fast cure electrically non-conductive epoxy for mechanical attachment and a slow cure electrically conductive epoxy for electrical interconnects. The two epoxies are selectively applied between the two substrates as a stack, and the stack is subjected to a temperature that is sufficient to cure the fast cure electrically non-conductive epoxy in a short period of time but does not damage the substrates or components coupled thereto. In some embodiments, the temperature is less than 100 degrees Celsius and the time period is less than 5 seconds. The stack is removed from the heat and the slow cure electrically conductive epoxy continues to cure over a longer second period of time, such as a few hours to a day.

In an aspect, an electrical device is disclosed. The electrical device includes a first substrate, a second substrate, a slow curing electrically conductive epoxy positioned between the first substrate and the second substrate, wherein the slow curing electrically conductive epoxy forms an electrical interconnection between the first substrate and the second substrate when cured, and a fast curing electrically non-conductive epoxy positioned between the first substrate and the second substrate, where the fast curing electrically non-conductive epoxy mechanically joins the first substrate and the second substrate when cured. In some embodiments, the first substrate is one of a plastic, a ceramic, a glass or a printed circuit board. In some embodiments, the second substrate is one of a plastic, a ceramic, a glass or a printed circuit board. In some embodiments, the slow curing electrically conductive epoxy is a polyurethane epoxy. In some embodiments, the fast curing electrically non-conductive is cyano acrylate epoxy. In some embodiments, the slow curing electrically conductive epoxy and the fast curing electrically non-conductive epoxy do not overlap. In some embodiments, the fast curing electrically non-conductive epoxy cures at a temperature greater than ambient temperature and less than 100 degrees Celsius for a time period of less than 5 seconds.

In another aspect, a method of assembling an electrical device is disclosed. The method includes providing a first substrate and a second substrate, and applying a slow curing electrically conductive epoxy between the first substrate and the second substrate. The method also includes applying a fast curing electrically non-conductive epoxy between the first substrate and the second substrate. The fast curing electrically non-conductive epoxy is positioned at locations where electrical interconnections are to be formed between the first substrate and the second substrate. The first substrate and the second substrate form a stack with the slow curing electrically conductive epoxy and the fast curing electrically non-conductive epoxy sandwiched therebetween. The method also includes applying heat to the stack for a first period of time. The heat and the first period of time are sufficient to cure the fast curing electrically non-conductive epoxy but insufficient to completely cure the slow curing electrically non-conductive epoxy. The method also includes removing the stack from the heat for a second period of time during which the slow curing electrically conductive epoxy completely cures. In some embodiments, the first period of time is less than 5 seconds. In some embodiments, applying heat to the stack includes subjecting the stack to a temperature in a range that is greater than ambient temperature and less than 100 degrees Celsius. In some embodiments, applying the slow curing electrically conductive epoxy between the first substrate and the second substrate includes either applying the slow curing electrically conductive epoxy to the first substrate and then stacking the first substrate and the second substrate or applying the slow curing electrically conductive epoxy to the second substrate and then stacking the first substrate and the second substrate. In some embodiments, applying the fast curing electrically non-conductive epoxy between the first substrate and the second substrate includes either applying the fast curing electrically non-conductive epoxy to the first substrate and then stacking the first substrate and the second substrate or applying the fast curing electrically non-conductive epoxy to the second substrate and then stacking the first substrate and the second substrate. In some embodiments, applying the slow curing electrically conductive epoxy between the first substrate and the second substrate includes applying the slow curing electrically conductive epoxy to the first substrate and applying the slow curing electrically conductive epoxy to the second substrate such that the slow curing electrically conductive epoxy on both the first substrate and the second substrate are aligned when stacked. In some embodiments, applying the fast curing electrically non-conductive epoxy between the first substrate and the second substrate includes applying the fast curing electrically non-conductive epoxy to the first substrate and applying the fast curing electrically non-conductive epoxy to the second substrate such that the fast curing electrically non-conductive epoxy on both the first substrate and the second substrate are aligned when stacked. In some embodiments, the first substrate is one of a plastic, a ceramic, a glass or a printed circuit board. In some embodiments, the second substrate is one of a plastic, a ceramic, a glass or a printed circuit board. In some embodiments, the slow curing electrically conductive epoxy is a polyurethane epoxy. In some embodiments, the fast curing electrically non-conductive is cyano acrylate epoxy. In some embodiments, the slow curing electrically conductive epoxy and the fast curing electrically non-conductive epoxy do not overlap.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Figure 1:
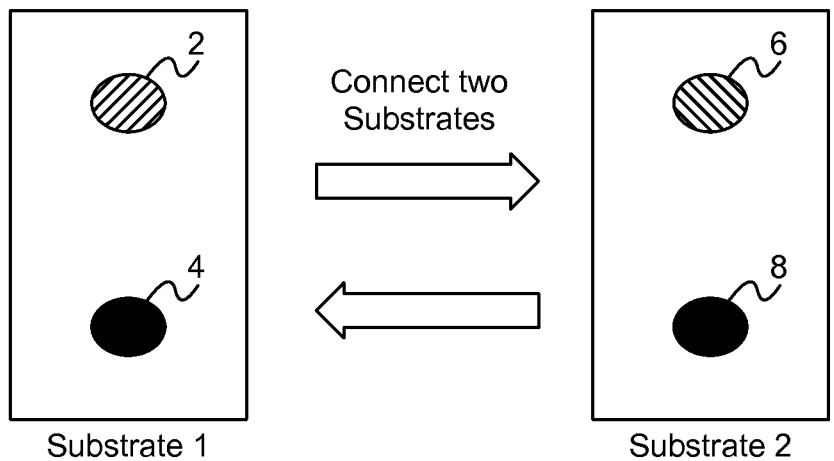
FIG. 1 illustrates a conceptual diagram of an electrical device and method of assembly according to an embodiment.

Embodiments of the present application are directed to a electrical device and method of assembly. Those of ordinary skill in the art will realize that the following detailed description of the electrical device and method of assembly is illustrative only and is not intended to be in any way limiting. Other embodiments of the electrical device and method of assembly will readily suggest themselves to such skilled persons having the benefit of this disclosure.

Reference will now be made in detail to implementations of the electrical device and method of assembly as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

The electrical device and method of assembly uses a combination of selected epoxies to attach electronic substrates and/or components at a curing temperature below 100 degrees Celsius for less than 5 seconds in an automated process that results in a tact time of less than 60 seconds. The tact time is the cycle time of a given process, or in other words the time taken to complete each process in an automated line. In an exemplary case of attaching two substrates, the tact time is directed to the time the automated line takes to attach the two substrates. This is faster than conventional processes. As used herein, a substrate can include, but is not limited to, a plastic, a ceramic, a glass or a printed circuit board. The substrate can also be a film. In the case where two substrates are attached together, the substrates can be of the same or different types. For example, one substrate can be a printed circuit board assembly and the other substrate can be a display. In another example, both substrates can be printed circuit boards, but with different designs and configurations.

The exemplary embodiment described below is directed to the attachment of two substrates. The two substrates include one or more electrical interconnects. Each electrical interconnection is formed by an electrically conductive epoxy. In high speed automated assembly processes, it is desirable to assemble the attached substrates as quickly as possible. Attaching the two substrates using the electrically conductive epoxy requires the epoxy to be cured, typically accomplished by applying heat to the epoxy. Once cured, the epoxy forms both an electrical interconnect as well as a mechanical attachment between the two substrates. However, many electronic devices and their accompanying components cannot be subjected to higher temperatures for fear of damage. Typically, such a temperature threshold is about 100 degrees Celsius. Unfortunately, curing an electrically conductive epoxy at temperatures less than 100 degrees requires an unacceptable amount of time for a high speed automated assembly processes. Subjecting the electrically conductive epoxy to a lower temperature for a shorter period results in epoxy that is not completed cured, providing insufficient electrical and mechanical coupling of the substrates.

As such, a second epoxy, which is a fast cure electrically non-conductive epoxy, is used to provide a mechanical attachment for the two substrates, while the first epoxy, the slow cure electrically conductive epoxy, is used to provided the electrical interconnects between the two substrates. The two substrates are stacked together with the two different uncured epoxies selectively applied between the two substrates. The stack is subjected to a temperature that is sufficiently low so as not to damage the substrates or accompanying components. In some embodiments, the temperature is less than 100 degrees Celsius for a time period of less than 5 seconds. The selected time period and temperature are sufficient to cure the fast cure electrically non-conductive epoxy, thereby providing a sufficient mechanical attachment of the two substrates. However, the selected time period and temperature are insufficient to completely cure the slow cure electrically conductive epoxy. Accordingly, after the stack is subjected to the selected temperature for the selected time period, the electrical interconnections between the two substrates are not sufficiently formed. Although the stack is removed from the applied heat, the slow cure electrically conductive epoxy continues to cure, for example at room temperature. Over the course of a second time period, such as a few hours to a full day, the slow cure electrically conductive epoxy completely cures and the electrical interconnects are sufficiently formed. This second period of time may occur as the stack is in storage or subjected to other assembly processes.

FIG. 1 illustrates a conceptual diagram of an electrical device and method of assembly according to an embodiment. The electrical device includes a substrate 1 and a substrate 2 that are mechanically and electrically coupled. The substrate 1 and the substrate 2 can be of the type described above and may include one or more active electrical components, passive electrical components and electrical interconnects coupled to the substrate. Fast cure electrically non-conductive epoxy is used to establish a fast mechanical attachment when the electrical device is subjected to heat as part of an automated assembly process. Slow cure electrically conductive epoxy is used to establish electrical interconnections once completely cured during a subsequent time period, which can take place either on-line or off-line of the automated assembly process.

When attaching substrate 1 to substrate 2 during the automated assembly process, epoxy can be placed on either substrate 1, substrate 2 or both substrates 1 and 2. In the exemplary embodiment shown in FIG. 1, epoxy is placed on both substrates 1 and 2 such that when substrate 1 is coupled to substrate 2, epoxy on substrate 1 is aligned with corresponding epoxy on substrate 2. For example, when substrate 1 is coupled to substrate 2 a fast cure electrically non-conductive epoxy 2 on substrate 1 is aligned with a fast cure electrically non-conductive epoxy 6 on substrate 2. In some embodiments, the fast cure electrically non-conductive epoxy 2 on the substrate 1 completely overlaps with the fast cure electrically non-conductive epoxy 6 on substrate 2. In other embodiments, the fast cure electrically non-conductive epoxy 2 on the substrate 1 partially overlaps with the fast cure electrically non-conductive epoxy 6 on substrate 2. Examples of fast cure electrically non-conductive epoxies include, but are not limited to, cyano acrylate epoxy. Similarly, the slow cure electrically conductive epoxy 4 on substrate 1 is aligned with the slow cure electrically conductive epoxy 8 on substrate 2. In some embodiments, the slow cure electrically conductive epoxy 4 on the substrate 1 completely overlaps with the slow cure electrically conductive epoxy 8 on substrate 2. In other embodiments, the slow cure electrically conductive epoxy 4 on the substrate 1 partially overlaps with the slow cure electrically conductive epoxy 8 on substrate 2. An example of a slow cure electrically conductive epoxy includes, but is not limited to, polyurethane epoxy. The fast cure electrically non-conductive epoxy and the slow cure electrically conductive epoxy are applied so as to not overlap with each other. As applied to substrates 1 and 2 shown in FIG. 1, to attach the two substrates one of the substrates is turned upside down so that the epoxy is facing downward relative to the other substrate, and the upside down substrate is positioned on the right side up other substrate such that the corresponding epoxy areas on each substrate appropriately contact each other, thereby forming a stack. Once stacked, the electronic device is subjected to the curing temperature for a time period sufficient to completely cure the fast cure electrically non-conductive epoxy. The stack is then removed from the heat, and the slow cure electrically conductive epoxy is allowed to completely cure, either on-line or off-line of the automated assembly process.

Figure 2:
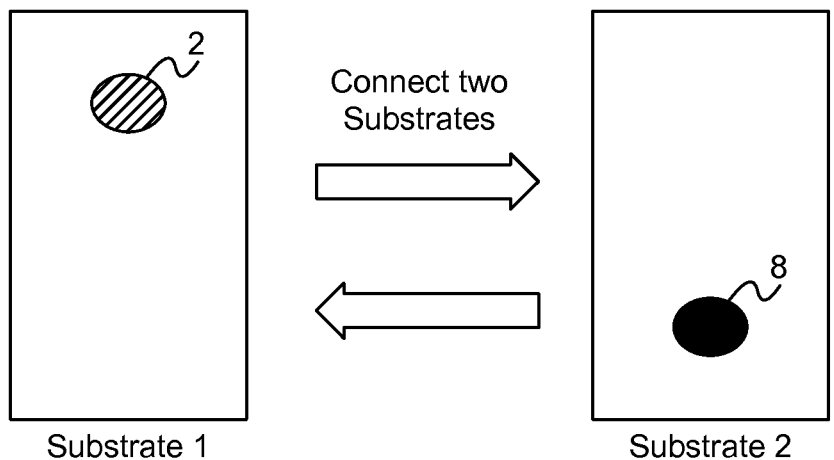
FIG. 2 illustrates a conceptual diagram of an electrical device and method of assembly according to another embodiment.
Figure 3:
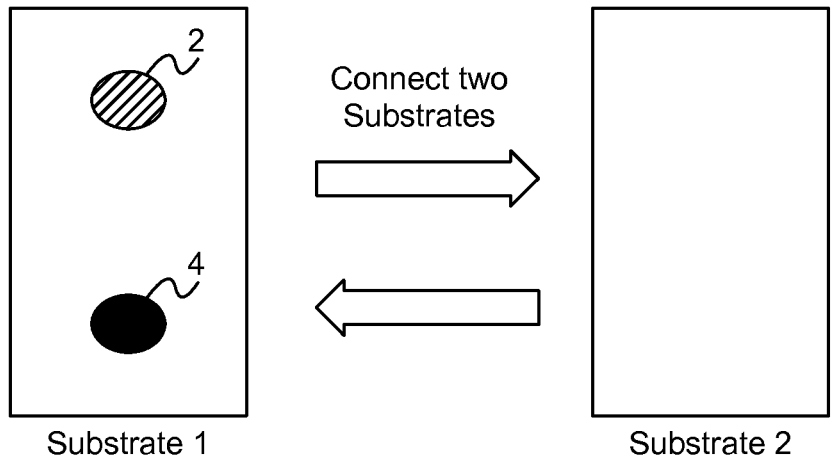
FIG. 3 illustrates a conceptual diagram of an electrical device and method of assembly according to yet another embodiment.

FIG. 1 shows both the slow cure and fast cure epoxies being applied to overlapping portions on both substrates. Alternatively, epoxy can be placed on either substrate 1 or substrate 2. FIG. 2 illustrates a conceptual diagram of an electrical device and method of assembly according to another embodiment. FIG. 2 is similar to FIG. 1 except that the fast cure electrically non-conductive epoxy is applied only to one substrate and the slow cure electrically conductive epoxy is applied only to the other substrate, prior to stacking of the two substrates. In the exemplary embodiment shown in FIG. 2, the fast cure electrically non-conductive epoxy 2 is applied only to the substrate 1, and the slow cure electrically conductive epoxy 8 is applied only to the substrate 2 prior to stacking substrates 1 and 2. FIG. 3 illustrates a conceptual diagram of an electrical device and method of assembly according to yet another embodiment. FIG. 3 is similar to FIG. 1 except that the fast cure electrically non-conductive epoxy and the slow cure electrically conductive epoxy are both applied only to one substrate prior to stacking of the two substrates. In the exemplary embodiment shown in FIG. 3, the fast cure electrically non-conductive epoxy 2 and the slow cure electrically conductive epoxy 4 are applied only to the substrate 1 prior to stacking of substrates 1 and 2.

The electrical device and method of assembly enables the attachment of temperature sensitive components with electrically conductive and non-conductive epoxies in an automated assembly line. The electrical device and method of assembly uses a combination of selected epoxies to mechanically and electrically attach electronic substrates/components below a damaging temperature in an automated assembly process that significantly reduces a tact time of the automated assembly process.

The present application has been described in terms of specific embodiments incorporating details to facilitate the understanding of the principles of construction and operation of the electrical device and method of assembly. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An electrical device comprising:
   a. a first substrate;
   b. a second substrate;
   c. a slow curing electrically conductive epoxy positioned between the first substrate and the second substrate, wherein the slow curing electrically conductive epoxy forms an electrical interconnection between the first substrate and the second substrate when cured; and
   d. a fast curing electrically non-conductive epoxy positioned between the first substrate and the second substrate, where the fast curing electrically non-conductive epoxy mechanically joins the first substrate and the second substrate when cured.

2. The electrical device of claim 1 wherein the first substrate comprises one of a plastic, a ceramic, a glass or a printed circuit board.

3. The electrical device of claim 1 wherein the second substrate comprises one of a plastic, a ceramic, a glass or a printed circuit board.

4. The electrical device of claim 1 wherein the slow curing electrically conductive epoxy comprises polyurethane epoxy.

5. The electrical device of claim 1 wherein the fast curing electrically non-conductive comprises cyano acrylate epoxy.

6. The electrical device of claim 1 wherein the slow curing electrically conductive epoxy and the fast curing electrically non-conductive epoxy do not overlap.

7. The electrical device of claim 1 wherein the fast curing electrically non-conductive epoxy cures at a temperature greater than ambient temperature and less than 100 degrees Celsius for a time period of less than 5 seconds.

8. A method of assembling an electrical device comprising:
   a. providing a first substrate and a second substrate;
   b. applying a slow curing electrically conductive epoxy between the first substrate and the second substrate;
   c. applying a fast curing electrically non-conductive epoxy between the first substrate and the second substrate, wherein the fast curing electrically non-conductive epoxy is positioned at locations where electrical interconnections are to be formed between the first substrate and the second substrate, further wherein the first substrate and the second substrate form a stack with the slow curing electrically conductive epoxy and the fast curing electrically non-conductive epoxy sandwiched therebetween;
   d. applying heat to the stack for a first period of time, wherein the heat and the first period of time are sufficient to cure the fast curing electrically non-conductive epoxy but insufficient to completely cure the slow curing electrically non-conductive epoxy; and
   e. removing the stack from the heat for a second period of time during which the slow curing electrically conductive epoxy completely cures.

9. The method of claim 8 wherein the first period of time is less than 5 seconds.

10. The method of claim 8 wherein applying heat to the stack comprises subjecting the stack to a temperature in a range that is greater than ambient temperature and less than 100 degrees Celsius.

11. The method of claim 8 wherein applying the slow curing electrically conductive epoxy between the first substrate and the second substrate comprises either applying the slow curing electrically conductive epoxy to the first substrate and then stacking the first substrate and the second substrate or applying the slow curing electrically conductive epoxy to the second substrate and then stacking the first substrate and the second substrate.

12. The method of claim 8 wherein applying the fast curing electrically non-conductive epoxy between the first substrate and the second substrate comprises either applying the fast curing electrically non-conductive epoxy to the first substrate and then stacking the first substrate and the second substrate or applying the fast curing electrically non-conductive epoxy to the second substrate and then stacking the first substrate and the second substrate.

13. The method of claim 8 wherein applying the slow curing electrically conductive epoxy between the first substrate and the second substrate comprises applying the slow curing electrically conductive epoxy to the first substrate and applying the slow curing electrically conductive epoxy to the second substrate such that the slow curing electrically conductive epoxy on both the first substrate and the second substrate are aligned when stacked.

14. The method of claim 8 wherein applying the fast curing electrically non-conductive epoxy between the first substrate and the second substrate comprises applying the fast curing electrically non-conductive epoxy to the first substrate and applying the fast curing electrically non-conductive epoxy to the second substrate such that the fast curing electrically non-conductive epoxy on both the first substrate and the second substrate are aligned when stacked.

15. The method of claim 8 wherein the first substrate comprises one of a plastic, a ceramic, a glass or a printed circuit board.

16. The method of claim 8 wherein the second substrate comprises one of a plastic, a ceramic, a glass or a printed circuit board.

17. The method of claim 8 wherein the slow curing electrically conductive epoxy comprises polyurethane epoxy.

18. The method of claim 8 wherein the fast curing electrically non-conductive comprises cyano acrylate epoxy.

19. The method of claim 8 wherein the slow curing electrically conductive epoxy and the fast curing electrically non-conductive epoxy do not overlap.

* * * * *